United States Patent [19]

Banerjee et al.

[11] Patent Number: 5,557,502
[45] Date of Patent: Sep. 17, 1996

[54] STRUCTURE OF A THERMALLY AND ELECTRICALLY ENHANCED PLASTIC BALL GRID ARRAY PACKAGE

[75] Inventors: Koushik Banerjee; Debendra Mallik; Ashok Seth, all of Chandler, Ariz.

[73] Assignee: Intel Corporation, Santa Clara, Calif.

[21] Appl. No.: 399,162

[22] Filed: Mar. 2, 1995

[51] Int. Cl.$^6$ .................................................. H05K 7/20
[52] U.S. Cl. .................. 361/712; 174/261; 257/713; 361/719; 361/764
[58] Field of Search .................. 439/68, 74, 76, 439/485; 165/80.3, 185; 257/706, 707, 712, 713; 174/16.3, 252, 260, 261, 52.2, 52.4; 361/761, 763, 764, 792, 794, 795, 704, 707, 712, 717–719, 767, 777, 778

[56] References Cited

U.S. PATENT DOCUMENTS

| | | | |
|---|---|---|---|
| 4,420,767 | 12/1983 | Hodge | 357/81 |
| 4,819,041 | 4/1989 | Redmond | 357/80 |
| 4,899,118 | 2/1990 | Polinski, Sr. | 333/246 |
| 5,218,515 | 6/1993 | Bernhardt | 361/385 |
| 5,285,352 | 2/1994 | Pastore | 361/764 |
| 5,291,062 | 3/1994 | Higgins, III | 257/698 |
| 5,355,283 | 10/1994 | Marrs | 361/760 |
| 5,357,672 | 10/1994 | Newman | 29/830 |
| 5,400,220 | 3/1995 | Swamy | 361/760 |
| 5,442,852 | 8/1995 | Danner | 29/843 |

*Primary Examiner*—Gerald P. Tolin
*Attorney, Agent, or Firm*—Blakely, Sokoloff, Taylor & Zafman

[57] ABSTRACT

An integrated circuit package which has internal bonding pads that are located on bonding shelves and coupled to internal conductive power/ground planes by conductive strips that extend along the edges of the shelves. The edge strips eliminate the need for conventional vias to couple the bonding pads to the planes and thus reduce the cost and size of the package and improve package electrical performance (less inductive, less resistance path). The bonding pads are coupled to an integrated circuit that is mounted to a heat slug attached to a top surface of the package. The heat slug can function as both a ground path and a thermal sink for the integrated circuit. The package may have capacitors coupled to the internal routing of the package to reduce the electrical noise of the signals provided to the integrated circuit. Additionally, the package may have multiple power planes dedicated to different voltage levels. The bonding pads and conductive planes are coupled to landing pads located on a bottom surface of the package. Attached to the landing pads are solder balls which can be soldered to an external printed circuit board.

16 Claims, 4 Drawing Sheets

STRUCTURE OF A THERMALLY AND ELECTRICALLY ENHANCED PLASTIC BALL GRID ARRAY PACKAGE

BACKGROUND OF THE INVENTION

1. Field of the Invention

The present invention relates to an integrated circuit package.

2. Description of Related Art

Integrated circuits (Its) are typically housed within a package that is soldered to a printed circuit board. The IC package can be soldered to the printed circuit board by a plurality of solder balls. Such a package is commonly referred to as a ball grid array (BGA). BGA packages can be used to house large integrated circuit devices such as microprocessors. Microprocessors generate a relatively large amount of heat and typically require a significant number of input/output (I/O) pins. The heat increases the junction temperatures, which may affect the performance of the integrated circuit. It is therefore desirable to have a thermally efficient package structure to remove the heat from the IC. The high I/O requirements of a microprocessor typically increase the routing space and overall size of the package and the printed circuit board assembly. It is therefore desirable to provide a BGA package that is both compact and thermally efficient.

Microprocessors operate at relatively high speeds, wherein noise can be introduced to the signals traveling between the integrated circuit and the printed circuit board. The microprocessor may also require multiple voltage levels. It would be desirable to provide a compact, thermally efficient BGA package that reduces electrical noise and allows multiple voltage levels to be supplied to the integrated circuit.

SUMMARY OF THE INVENTION

The present invention is an integrated circuit package which has internal bonding pads that are located on bonding shelves and coupled to internal conductive power/ground planes by conductive strips that extend along the edges of the shelves. The edge strips eliminate the need for conventional vias to couple the bonding pads to the planes and thus reduces the cost and size of the package. The edge strips also improve the electrical performance of the package. The bonding pads are coupled to an integrated circuit that is mounted to a heat slug attached to a top surface of the package. The heat slug can function as both a ground path and a thermal sink for the integrated circuit. The package may have capacitors coupled to the internal routing of the package to reduce the electrical noise of the signals provided to the integrated circuit. Additionally, the package may have multiple power planes dedicated to different voltage levels. The bonding pads and conductive planes are coupled to landing pads located on a bottom surface of the package. Attached to the landing pads are solder balls which can be soldered to an external printed circuit board.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
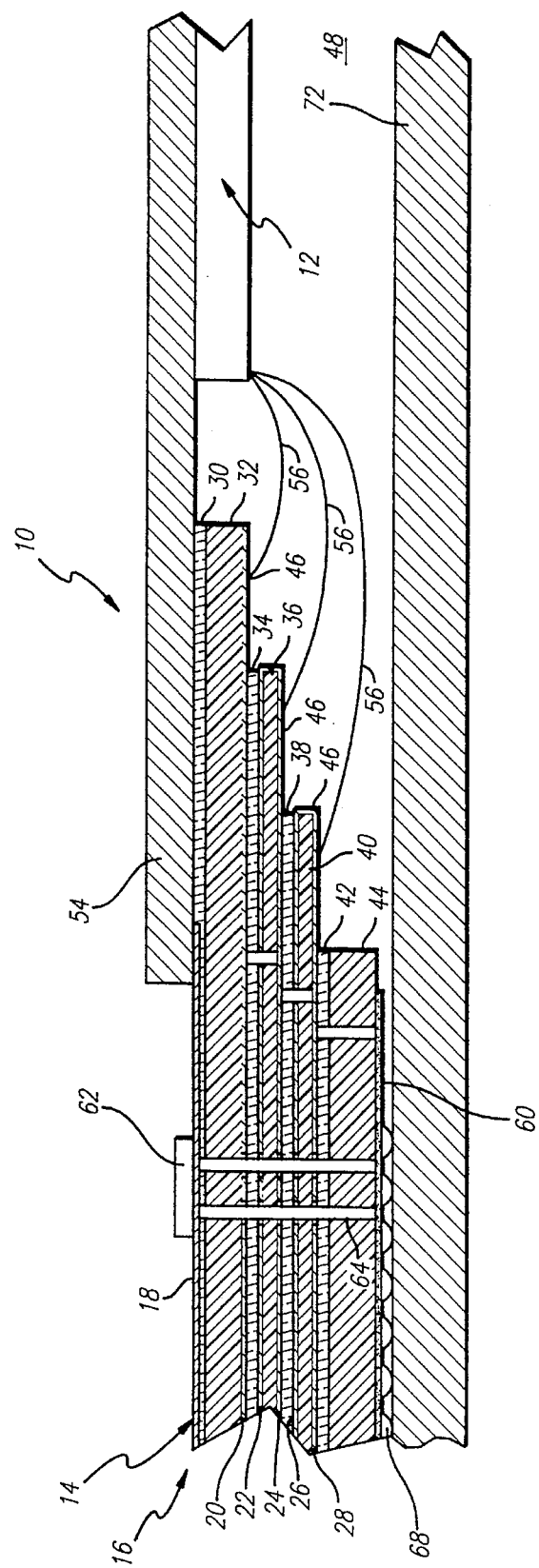
FIG. 1 is a cross-sectional view of an integrated circuit package assembly of the present invention.
Figure 2:
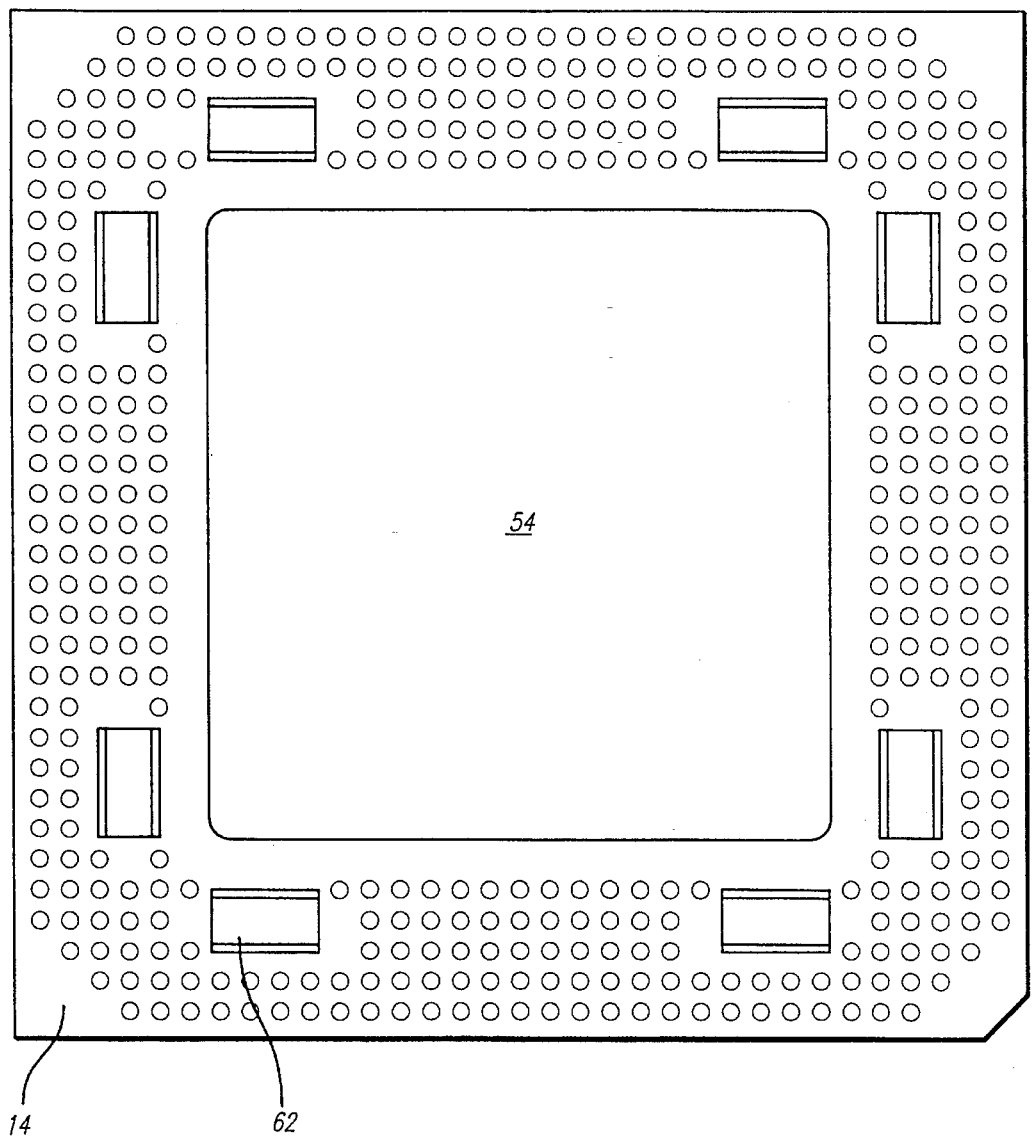
FIG. 2 is a top view of the integrated circuit package.
Figure 3:
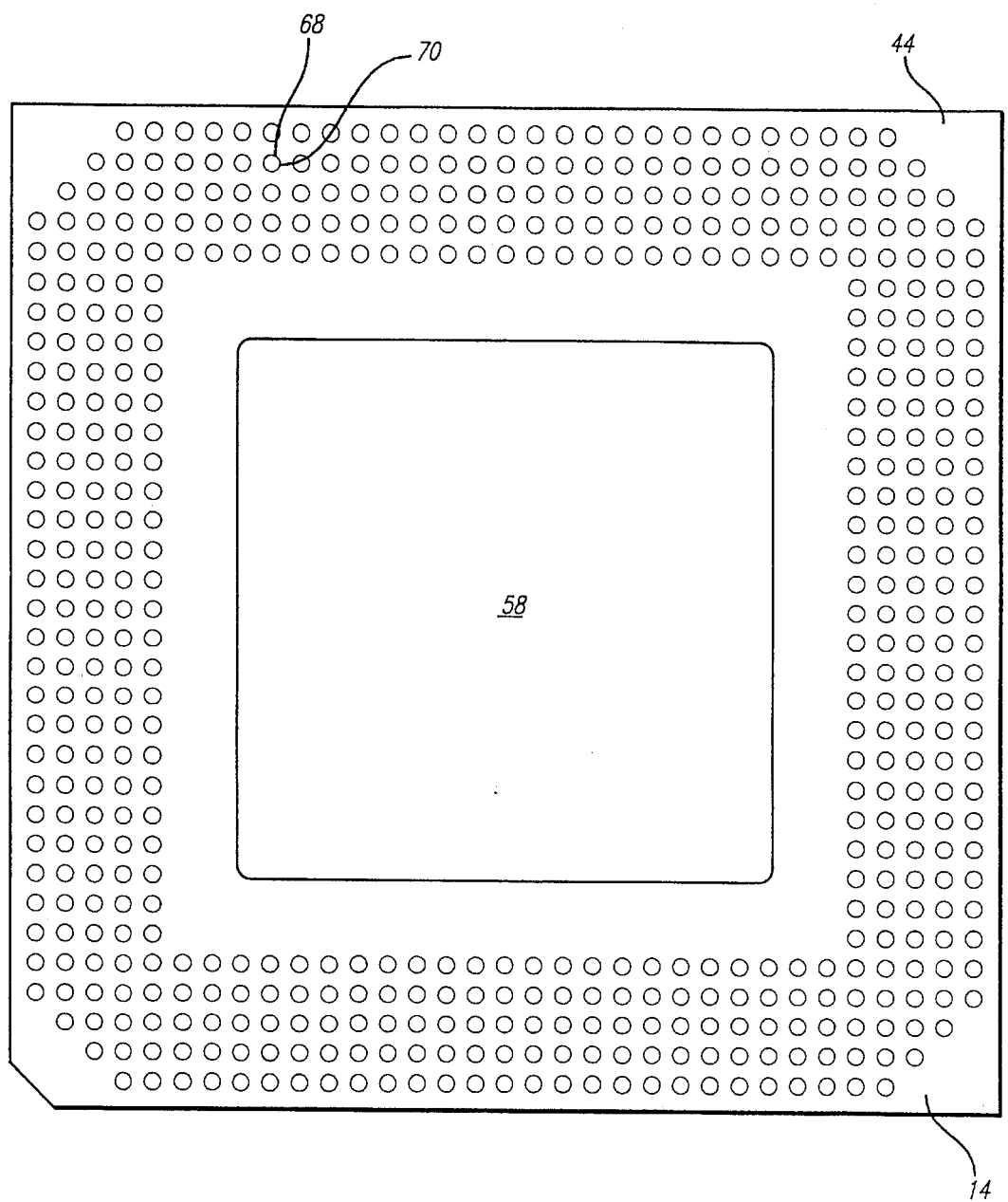
FIG. 3 is a bottom view of the integrated circuit package.

Referring to the drawings more particularly by reference numbers, FIGS. 1–3 show an integrated circuit package assembly 10 of the present invention. The assembly 10 includes an integrated circuit 12 located within a package 14. The integrated circuit 12 may be an electronic device such as a microprocessor. Although a single integrated circuit 12 is shown and described, it is to be understood that multiple integrated circuits, or other non-IC electronic devices can be housed within the package 14 of the present invention.

The package assembly 10 contains a multi-layer printed circuit board 16. The circuit board 16 has a number of conductive layers 18–28 separated by dielectric layers 32–44. The conductive layers 20, 24 and 28 have inner bonding pads 46 located within an inner cavity 48 of the package assembly 10. In the preferred embodiment, the multi-layer printed circuit board is constructed from four different conventional printed circuit boards that have conductive lines/planes on one or both sides of a hard dielectric substrate (32, 36, 40 and 44). The substrate may be a glass filled epoxy or other conventional printed circuit board material. The printed circuit boards are typically bonded together with an adhesive such as a polyimide (34, 38, and 42). Constructing the package 14 with conventional printed circuit board technology decreases the cost of developing and producing the multilayer package 14.

The conductive layers of the multi-layer printed circuit board 16 are constructed to transmit both power and digital signals, wherein the digital signals are typically carried by individual leads and power is supplied on conductive planes. In the preferred embodiment, conductive layers 18 and 26 are dedicated to ground (VSS), conductive layers 20 and 22 provides power (VCC), and layers 24 and 28 carry digital signals. Each power layer can provide a different level of power. For example, the conductive layer 20 can be coupled to a 5 V power supply and conductive layer 22 can be coupled to a 3.3 V power supply. The integrated circuit 12 can be wire bonded to one or both power layers 20 and 22 depending upon the power requirements of the circuit 12.

Figure 4:
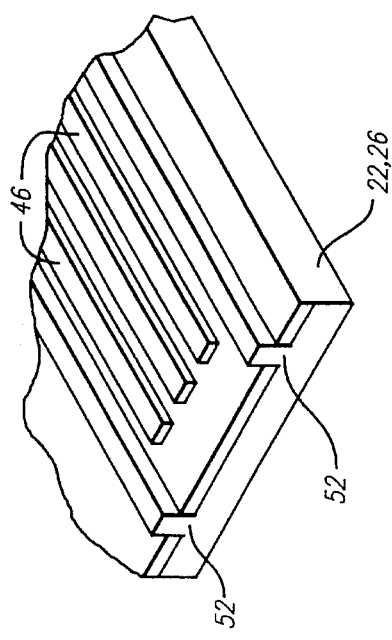
FIG. 4 is an enlarged sectional view showing a plurality of bonding pads of the package.

As shown in FIG. 4, the bonding pads 46 are located on tiered shelves of the package 14. Some of the bonding pads 46 have additional strips 52 that wrap around the end of the dielectric material and are connected to an adjacent underlying conductive layer 22 or 26. The wrap around feature provides an interconnect between the bonding pads 46 and the conductive planes 22 or 26 without using any vias.

Attached to the printed circuit board 16 is a heat slug 54. The heat slug 54 is preferably constructed from a material such as copper that is both thermally and electrically conductive. The heat slug 54 may be mounted to conductive layer 18 with an electrically and thermally conductive adhesive 30. Mounted to the heat slug 54 is the integrated circuit 12. Ground pads located on the bottom of the integrated circuit 12 can be electrically coupled to the heat slug 54. The heat slug 54 provides a ground plane for the package and electrically couples the circuit 12 to the circuit board 16. The heat slug 54 can thus provide the dual functions of a ground plane and a thermal sink.

The integrated circuit 12 also contains outer surface pads (not shown) that are coupled to corresponding inner bonding pads 46 by wires 56. The wires 56 can be attached to the circuit 12 and the bonding pads 46 by conventional wire bonding techniques. After the integrated circuit 12 is bonded to the printed circuit board 16 the inner cavity 48 is filled with an encapsulant 58 that encloses the circuit 12. A solder mask 60 is applied to the outer surfaces of the package to insulate the outer layers of the circuit board 16.

A passive element 62 such as a capacitor can be attached to the circuit board 16. The capacitor 62 which is attached to the ground plane (18) is connected to the power planes by plated through hole vias 64.

As shown in FIG. 3, the bottom layer 44 of the circuit board 16 has a plurality of solder balls 68 attached to a plurality of landing pads 70. The landing pads 70 are coupled to the integrated circuit 12 by the vias and routing of the package 14. As shown in FIG. 1, the solder balls 68 are attached to a printed circuit board 72.

Figure 5:
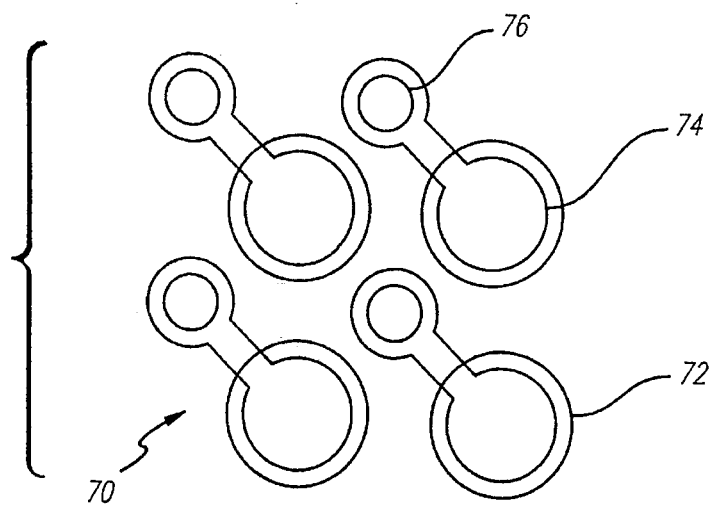
FIG. 5 is a bottom view of a ball landing of the package.
Figure 6:
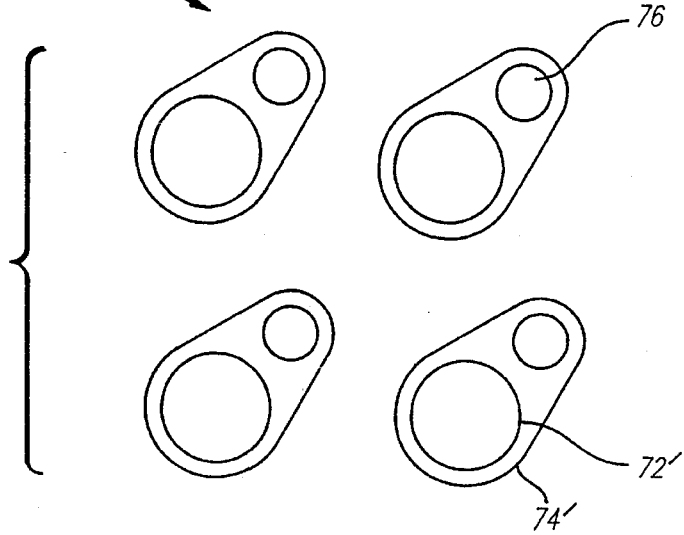
FIG. 6 is an alternate embodiment of a ball landing.
Figure 7:
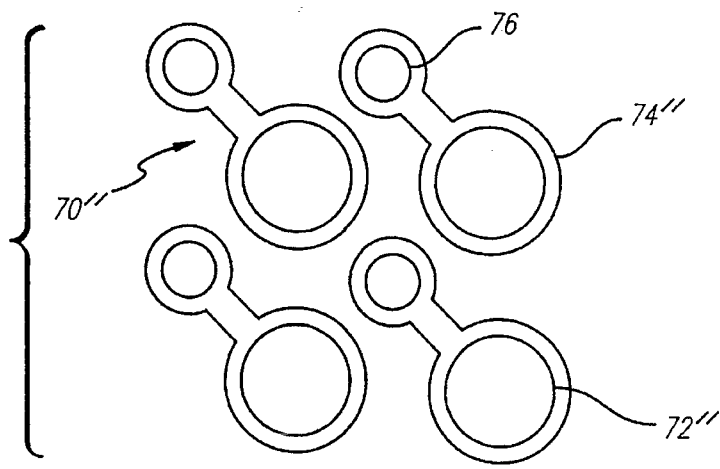
FIG. 7 is an alternate embodiment of a ball landing.

FIGS. 5–7 show alternate landing pad 70, 70' and 70" configurations. To prevent shorting and environmental contamination, the solder resist 60 is typically applied across the bottom surface of the package 14. Openings 72, 72' and 72" are formed above the lands 74, 74' and 74", respectively, to allow the solder balls 68 to be attached thereto. The openings 72 can be made larger than the land 74 as shown in FIG. 5 or smaller than the land 74" as shown in FIG. 7. The lands are connected to vias 76 that couple the solder balls 68 to the internal routing of the package.

To assemble a package assembly 10, the individual printed circuit boards are bonded together by adhesive to create the multilayer printed circuit board 16. The individual printed circuit boards can be bonded together using conventional lamination techniques. Before the boards are bonded to together, the conductive planes and traces are etched into a desired pattern to create conductive layers 18–28. The heat slug is mounted to the top of the printed circuit board 16 and the solder resist 60 is applied to the outer surfaces of the circuit board.

After the multi-layer board 16 and heat slug 54 are assembled, the solder balls 68 can be attached to the landing pads 70. The package is typically shipped as a separate unit for subsequent usage with an integrated circuit 12. The integrated circuit 12 is mounted to the heat slug 58 and wire bonded to the printed circuit board 16. The package may then be tested and filled with an encapsulant (not shown) to enclose the circuit 12.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A ball grid array package for an intergrated circuit comprising:

a circuit board that has an external landing pad and an internal conductive plane that is said internal conductive plane and said shelf being on different levels, electrically coupled to said landing pad, said circuit board further having an internal shelf and a bounding pad thereon, wherein said internal conductive plane is connected to said bounding pad by a conductive strip that extends around an end edge of said shelf;

a heat slug attached to an external surface of said circuit board; and a solder ball attached to said landing pad of said circuit board.

2. The package as recited in claim 1, wherein said heat slug is electrically coupled to a second conductive plane.

3. The package as recited in claim 1, further comprising a passive element attached to said circuit board.

4. The package as recited in claim 3, wherein said passive element is a capacitor mounted to an external conductive plane of said circuit board.

5. The package as recited in claim 1, wherein said landing pad is coupled to said conductive plane by a via.

6. A ball grid array package assembly, comprising:

a circuit board that has an external landing pad and an internal conductive plane that is said internal conductive plane and said shelf being on different levels, electrically coupled to said landing pad, said circuit board further having an internal shelf and a bonding pad thereon, wherein said internal conductive plane is connected to said bonding pad by a conductive strip that extends around an end edge of said shelf;

a heat slug attached to an external surface of said circuit board; an integrated circuit mounted to said heat slug; and, a solder ball attached to said landing pad of said circuit board.

7. The package assembly as recited in claim 6, wherein said integrated circuit is electrically coupled to said heat slug.

8. The package assembly as recited in claim 6, wherein said heat slug is electrically coupled to a second conductive plane.

9. The package assembly as recited in claim 6, further comprising a passive element attached to said circuit board.

10. The package assembly as recited in claim 6, wherein said passive element is a capacitor mounted to an external conductive plane of said circuit board.

11. A printed circuit board assembly, comprising:

a circuit board that has an external landing pad and an internal conductive plane that is said internal conductive plane and said shelf being on different levels, electrically coupled to said landing pad, said circuit board further having an external shelf and a bonding pad thereon, wherein said internal conductive plane is connected to said bonding pad by a conductive strip that extends around an end edge of said shelf;

a heat slug attached to an external surface of said circuit board;

an integrated circuit mounted to said heat slug;

a solder ball attached to said landing pad of said circuit board; and, a printed circuit board attached to said solder ball.

12. The board assembly as recited in claim 11, wherein said integrated circuit is electrically coupled to said heat slug.

13. The board assembly as recited in claim 12, wherein said heat slug is electrically coupled to a second conductive plane.

14. The board assembly as recited in claim 11, further comprising a passive element attached to said circuit board.

15. The board assembly as recited in claim 14, wherein said passive element is a capacitor mounted to an external conductive plane of said circuit board.

16. The board assembly as recited in claim 11, wherein said landing pad is coupled to said conductive plane by a via.

\* \* \* \* \*

UNITED STATES PATENT AND TRADEMARK OFFICE
CERTIFICATE OF CORRECTION

PATENT NO. : 5,557,502
DATED : September 17, 1996
INVENTOR(S) : Banerjee, et. al.

It is certified that error appears in the above-indentified patent and that said Letters Patent is hereby corrected as shown below:

In column 1 at line 12 delete "(Its)" and insert --(ICs)--

In column 3 at lines 61-62 delete "said internal conductive plane and said shelf being on different levels,"

In column 3 at line 64 delete "bounding" and insert --bonding--

In column 3 at line 65 insert --said internal conductive plane and said shelf being on different levels,-- following "thereon," and prior to "wherein"

In column 4 at lines 15-16 delete "said internal conductive plane and said shelf being on different levels."

UNITED STATES PATENT AND TRADEMARK OFFICE
CERTIFICATE OF CORRECTION

PATENT NO. : 5,557,502
DATED : September 17, 1996
INVENTOR(S) : Banerjee, et. al.

It is certified that error appears in the above-indentified patent and that said Letters Patent is hereby corrected as shown below:

In column 4 at line 21 insert --said internal conductive plane and said shelf being on different levels,-- following "thereon," and prior to "wherein"

In column 4 at lines 41-42 delete "said internal conductive plane and said shelf being on different levels,"

In column 4 at line 43 delete "external" and insert --internal--

In column 4 at line 44 insert --said internal conductive plane and said shelf being on different levels,-- following "thereon," and prior to "wherein"

Signed and Sealed this

Twenty-eighth Day of January, 1997

Attest:

BRUCE LEHMAN

Attesting Officer   Commissioner of Patents and Trademarks